US006977764B1

(12) United States Patent
Anderson et al.

(10) Patent No.: US 6,977,764 B1
(45) Date of Patent: Dec. 20, 2005

(54) HIGH-SPEED FIELD-EFFECT OPTICAL SWITCH

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 10/710,050

(22) Filed: Jun. 15, 2004

(51) Int. Cl.[7] .......... G02F 1/03
(52) U.S. Cl. .......... 359/254; 359/321
(58) Field of Search .......... 359/254, 321

(56) References Cited

U.S. PATENT DOCUMENTS

| | | | | |
|---|---|---|---|---|
| 4,795,225 | A * | 1/1989 | Sakai et al. | 385/16 |
| 5,329,137 | A * | 7/1994 | Taylor et al. | 257/21 |
| 2002/0102042 | A1 * | 8/2002 | Paniccia et al. | 385/8 |

* cited by examiner

*Primary Examiner*—Georgia Epps
*Assistant Examiner*—Richard Hanig
(74) *Attorney, Agent, or Firm*—Anthony J. Canale

(57) ABSTRACT

The invention relates to optical switching. Rapid, low-power optical switching is achieved by selectively substantially depleting majority carriers in a plurality of planes of semiconducting material to alter their transmissive response to incoming radiation.

29 Claims, 12 Drawing Sheets

HIGH-SPEED FIELD-EFFECT OPTICAL SWITCH

BACKGROUND OF INVENTION

1. Field of the Present Invention

The invention relates to optical switches, and more specifically, to the switching of light, or electromagnetic radiation, by electronic means.

2. Background of the Present Invention

Fiber optic communication has become a significant means of providing high bandwidth for digital and other communications. Low-loss fiber optics together with high-speed modulation techniques make optical communications the preferred medium for modern communication systems.

In order to provide effective communications, altering, or switching, the optical paths of communication light beams must be provided. This allows sets of signals to be transmitted to the desired destinations as needed.

Currently, a preferred method of switching such light beams is by guiding such beams with mirrors which can be mechanically moved to change the transmitted path when needed. Typically, an array of micro-mechanical mirrors are provided on a substrate to form a chip, and electrostatic forces are used to rotate the mirrors physically. This requires very high voltages, typically in excess of 100 Volts, in order to provide sufficient force to rotate the mirrors. Furthermore, because the mirrors are capable of rotating by any arbitrary angle, sophisticated electronic controls are necessary to provide feedback in order to ensure that the proper angles are achieved and maintained during operation. Such high voltage power supplies, and the associated electronics needed to control the electrostatic voltages to the micro-mechanical mirror chips, are expensive, large, consume significant power, and are relatively unreliable.

Other methods of switching optical signals have been proposed which also present certain limitations. One method is to use liquid crystals, which can be modulated through application of an electric field, to change from partially transmitting light to partially reflecting light. Unfortunately, while such liquid crystals do provide low power operation, they are limited to reflecting only light of a particular polarization, and are also very slow, switching in the time scale of milliseconds. Another alternative method is to use a material which undergoes a transition to a superconducting state. In this method a material becomes highly reflective when superconducting, and becomes a lossy transmitter of light when not in its superconducting state. Unfortunately, such systems must be chilled to very low temperatures, and also are relatively slow to switch, since they are switched by heating or cooling them about the critical temperature, or by providing large magnetic fields to break the superconductivity. Furthermore, such superconducting materials are relatively poor transmitters of light when not in a superconducting state.

Thus, high speed switching of optical signals without the use of high voltages and/or sophisticated electronic controls, and at ambient temperatures is desired.

SUMMARY OF INVENTION

Embodiments of the invention provide for high speed switching of optical signals without the use of high voltages and/or sophisticated electronic controls, and at ambient temperatures.

A first aspect of an embodiment of the invention relates to an integrated circuit chip comprising a first portion with a plurality of transistors comprised of a first plurality of discrete semiconductor bodies, and a least one optical switch comprised of a second plurality of discrete semiconductor bodies.

Another aspect of an embodiment of the invention relates to an optical switch receiving incoming radiation at a given frequency, said optical switch comprising a plurality of semiconductor bodies adjacent one another and having first and second respective majority carrier types, said plurality of semiconductor bodies being coupled to respective voltage sources, wherein said plurality of semiconductor bodies are selectively substantially depleted of majority carriers to alter a transmissive response of said bodies to said incoming radiation.

Yet another aspect of an embodiment of the invention relates to an optical switch comprising a plurality of fin bodies on a substrate, said plurality of fin bodies disposed parallel to one another and having central portions defining an optical path and doped end portions, a first plurality of said fin bodies having an end portion doped with a first dopant and a second plurality of said fin bodies having an end portion doped with a second dopant, said first plurality of said fin bodies being coupled to a first voltage source and said second plurality of said fin bodies being coupled to a second voltage source, wherein said plurality of fin bodies are selectively substantially depleted of majority carriers to alter a transmissive response of said fin bodies to incoming radiation.

Still another aspect of an emodiment of the invention relates to a method of forming an optical switch for receiving incoming radiation at a given frequency, the method comprising the steps of providing a substrate; removing portions of the substrate to form a plurality of semiconductor bodies adjacent one another; selectively doping an end portion of a first of said plurality of semiconductor bodies with a first dopant; and selectively doping an end portion of a second of said plurality of semiconductor bodies with a second dopant.

BRIEF DESCRIPTION OF DRAWINGS

Embodiments of the invention will be better understood by reference to the following drawings, in conjunction with the accompanying specification, in which.

DETAILED DESCRIPTION

Figure 1:
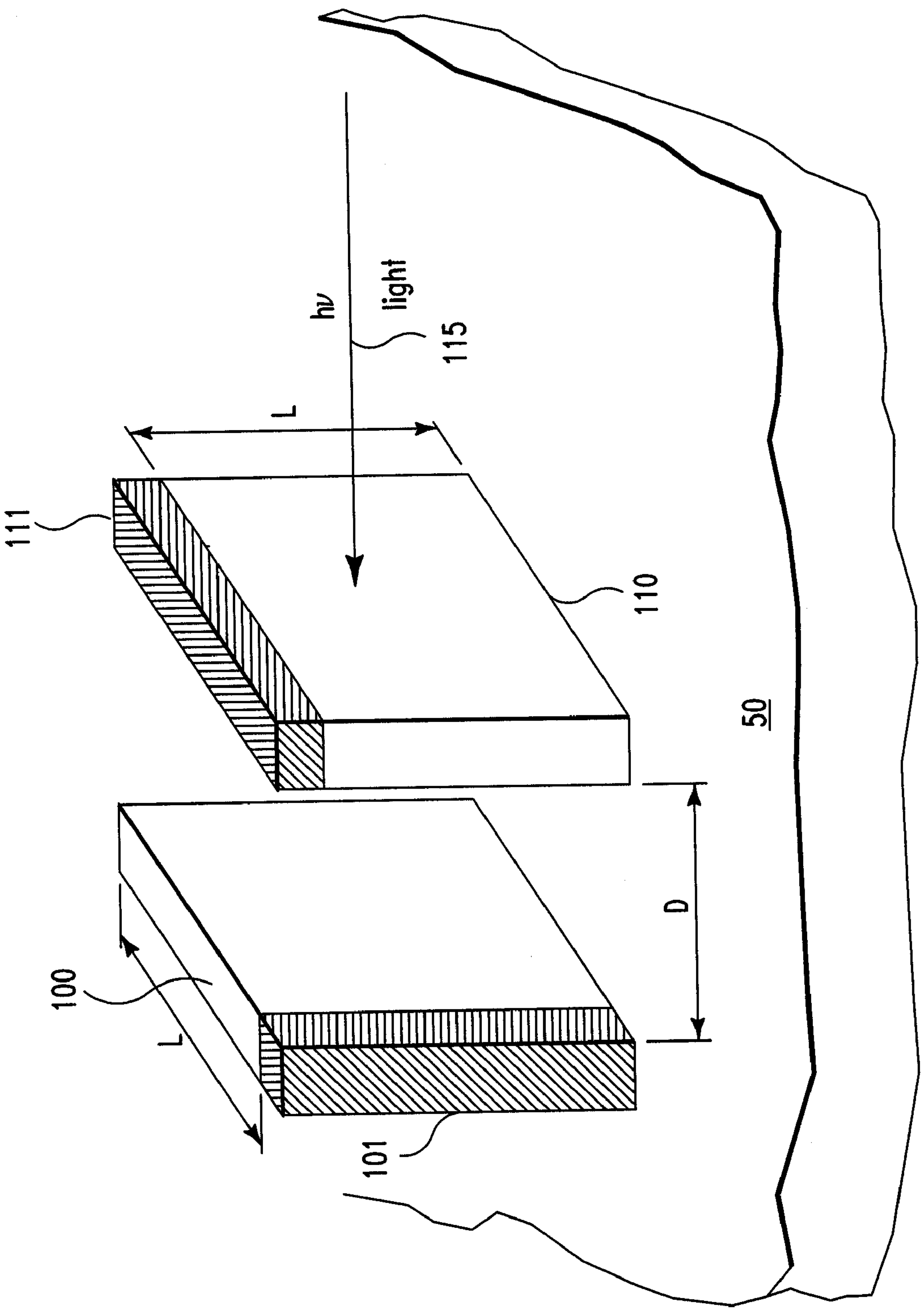
FIGS. 1 and 2 illustrate structures according to an embodiment of the invention.

Referring to FIG. 1, a substrate 50 such as, for example, a silicon-on-insulator (SOI) wafer, is provided having a first plane of semiconductor material 100 formed thereupon. The first plane 100 is of a thickness (greater than about 2 nanometers) sufficient to contain an inversion layer of carriers (e.g. electrons or holes). A second plane of semiconductor material 110, parallel to the first plane 100, and of similar thickness, is formed a distance D, typically between about 2 nm and about 100 nm, from the first plane 100. At least one edge 101 of the first plane 100 is doped a first dopant type such as, for example, an n-type dopant, and at least one edge 111 of the second plane 110 is doped a second dopant type such as, for example, a p-type dopant. The remaining portions of first and second planes 100, 110 are undoped or lightly doped. An electrical contact (not shown) to the n-type 101 and p-type 111 edges can be provided by methods known to those skilled in the art. When the electrical potential of the p-type edge 111 is less than that of the n-type edge 101 by a critical value, referred to as the threshold voltage, typically having a value of about 1 volt, almost no free electrical carriers (electrons or holes) are present in the first and second planes 100, 110. When a beam of light 115 is incident upon the first and second planes 100, 110, typically perpendicular to both planes, light 115 will pass through both planes substantially without attenuation since no free electrical carriers are present. When the electrical potential of the p-type edge 111 is more positive than that of the n-type edge 101 by an amount greater than about the threshold voltage, a very high density of electrons will 'flood' the first plane 100, and a very high density of holes will 'flood' the second plane 110. Light 115 incident upon the first and second planes 100, 110 in this condition will now be reflected, as though the planes 100, 110 were made of a metal, due to the large concentrations of free electrical carriers.

Figure 2:
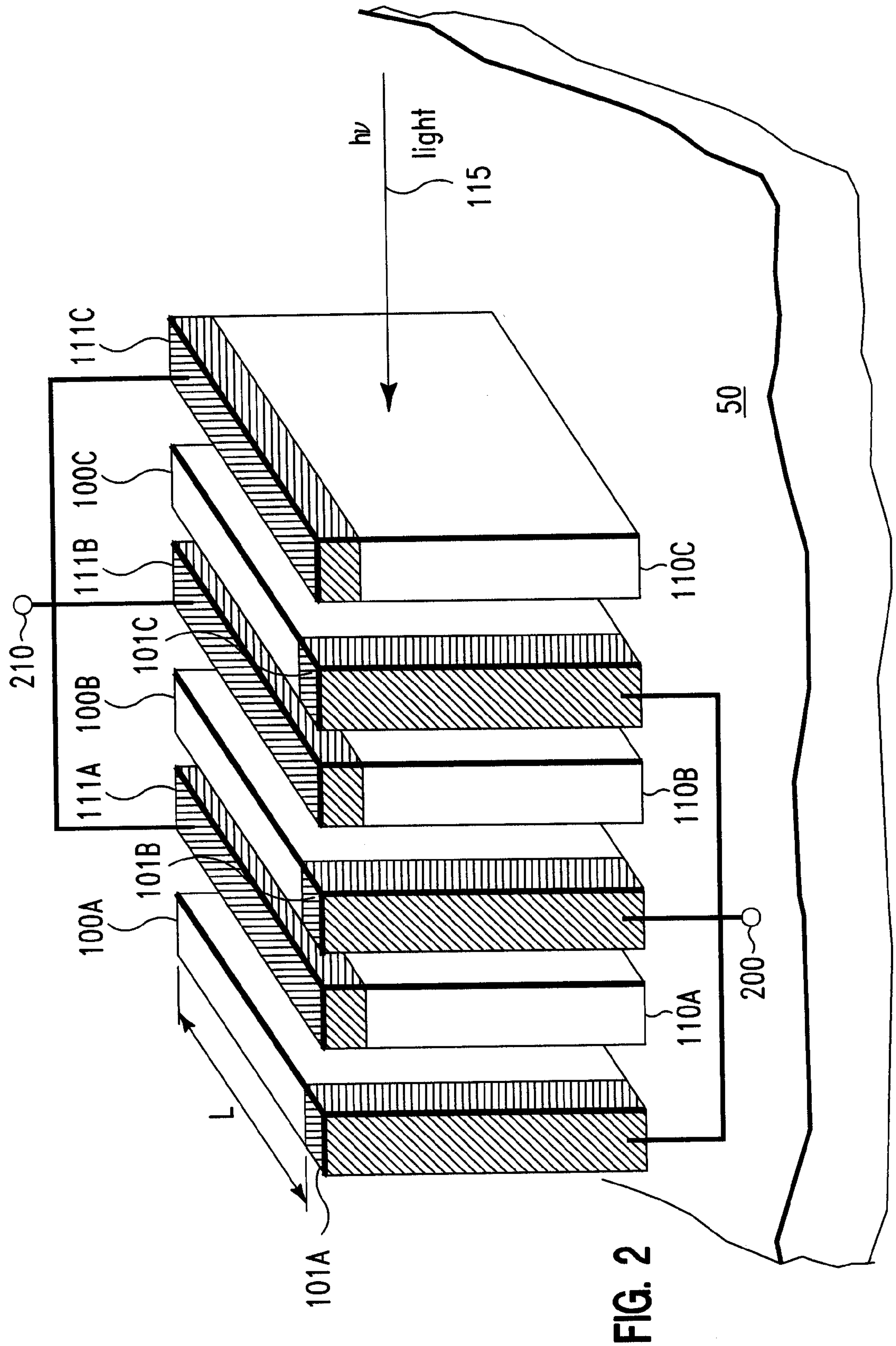

As the wavelength of light that is to be switched becomes shorter, a higher concentration of electrical carriers is required to effectively reflect the light when so desired. To accomplish this, FIG. 2 shows a first group of semiconductor planes 100A–C, each plane with at least one edge 101A–C doped n-type. A second group of semiconductor planes 110A–C are inter-digitated with the first group of planes 100A–C, each plane with at least one edge 111A–C doped p-type. The n-type edges 101A–C are electrically connected together to provide a first electrical terminal 200 and the p-type edges 111A–C are similarly electrically connected to provide a second electrical terminal 210. Since each individual plane can be thin (about 2 nm thick) a number of such planes may be stacked in parallel without adding a large mass of semiconductor in the path of the light 115. As was discussed hereinabove with reference to FIG. 1, when the voltage applied to the second terminal 210 is less than a threshold voltage above that of the first terminal 200, all of the first and second group of planes 100A–C, 111A–C will be devoid of electrical carriers and hence substantially transparent. When the voltage applied to the second terminal 210 exceeds that of the first terminal 200 by a threshold voltage, all of the first and second group of planes 100A–C, 111A–C will include high densities of electrons and holes, respectively, and hence, even shorter wavelengths of light 115 will be reflected.

Because no mechanical motion is required to alter the optical path, nor are any changes of temperature required, switching can be very fast. If the furthest distance in the plane of the semiconductor from the doped edge is given by L, then the maximum switching speed will be approximately $t_{sw}=L/v_{sat}$, where vsat is the saturation velocity of the carriers in the semiconductor (e.g. $v_{sat}\sim1\times10^{7}$ cm/s in silicon). For silicon planes having L=200 nm with doped regions on one edge, the intrinsic switching speed is approximately $2\times10^{-12}$ s, providing substantially faster switching than the prior art methods. Other semiconductor materials such as, for example, silicon carbide or gallium arsenide are also well suited to form the above mentioned planes. For greatest transpanrency when operated below the threshold voltage, semiconductors with bandgap energies in excess of hv should be used, where h is Plank's constant ($\sim6.6\times10^{-34}$ j-s) and v is the frequency of the light to be switched. This condition ensures that electron-hole pair production in the semiconductor planes cannot attenuate transmission of the light. While it is preferred that the semiconductor planes each be a single crystal, the planes can also comprise many, randomly aligned crystals known as polycrystalline semiconductors. Also, it is preferred to use a dielectric material with a dielectric constant equal to that of the semiconducting material for the paths leading into and away from the semiconductor planes. This will minimize reflection of the light at the dielectric/semiconductor interface when the semiconductor planes are not inverted.

Figure 3:
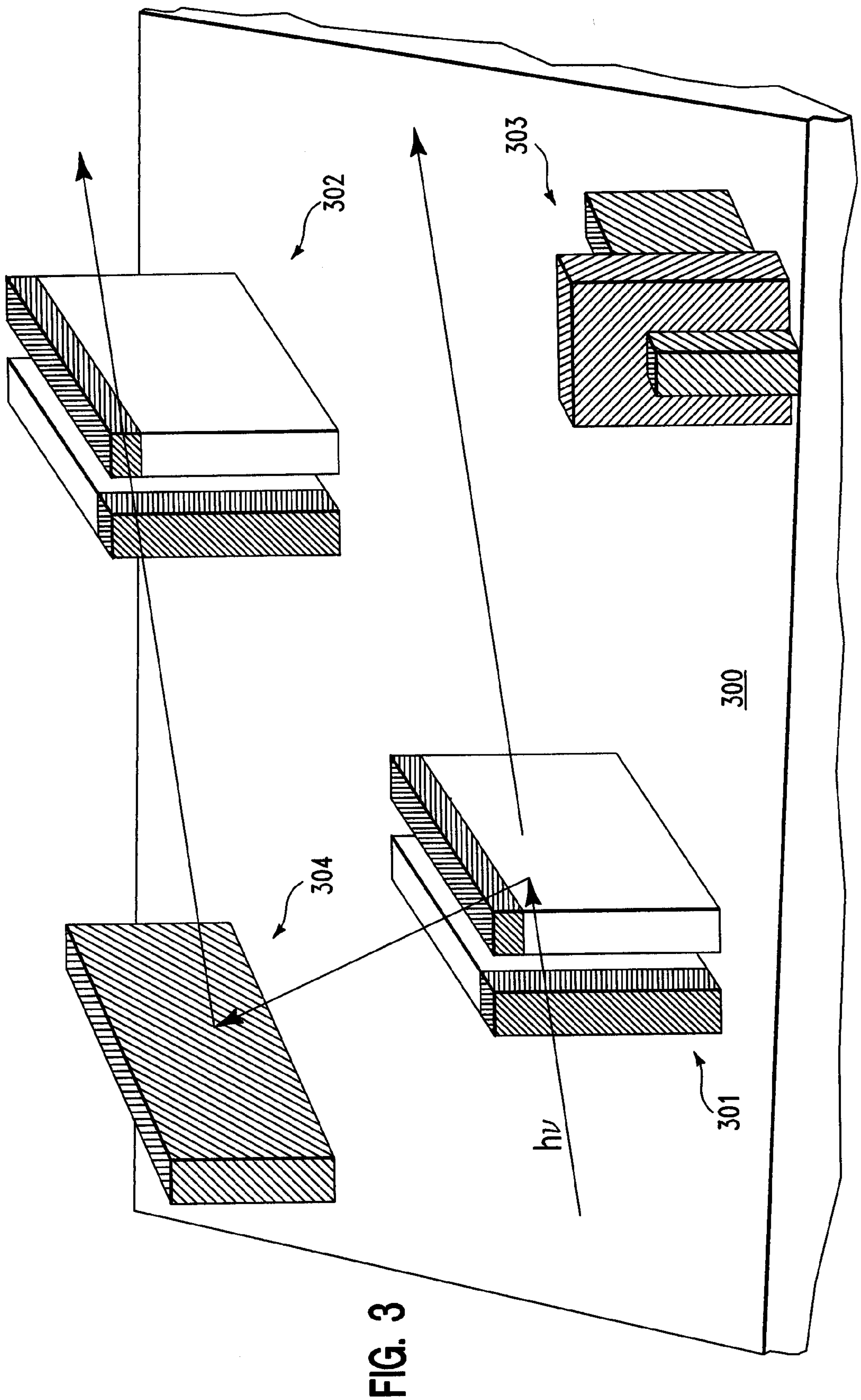
FIG. 3 shows an integration of the structures shown in FIGS. 1 and 2 to provide an integrated optical/electrical switching circuit.

Another aspect of an embodiment of the invention is illustrated in FIG. 3. Combinations of optical switches, such as those shown in FIGS. 1 and 2, together with mirrors and transistors can be integrated on the same integrated circuit. For example, upon a substrate 300, optical switches 301 and 302 are integrated together with transistor 303 and mirror 304. Suitable electrical interconnects can be added (not shown) to effect electrical connections between transistors and/or optical switches. Thus, an optical bench can be integrated on a single chip, to provide complex optical circuits according to an embodiment of the invention.

Yet another aspect of an embodiment of the invention is the ability to integrate electronic circuits with the optical switches and mirrors (as shown in FIG. 3) on the same substrate. As described hereinbelow, transistor bodies are formed simultaneously with the semiconductor planes during processing of the semiconductor layer. This aspect provides for electronic signal processing, optical signal processing, and combinations of optical and electronic processing, so as to realize the advantages of both media on a monolithic integrated circuit.

Figure 4:
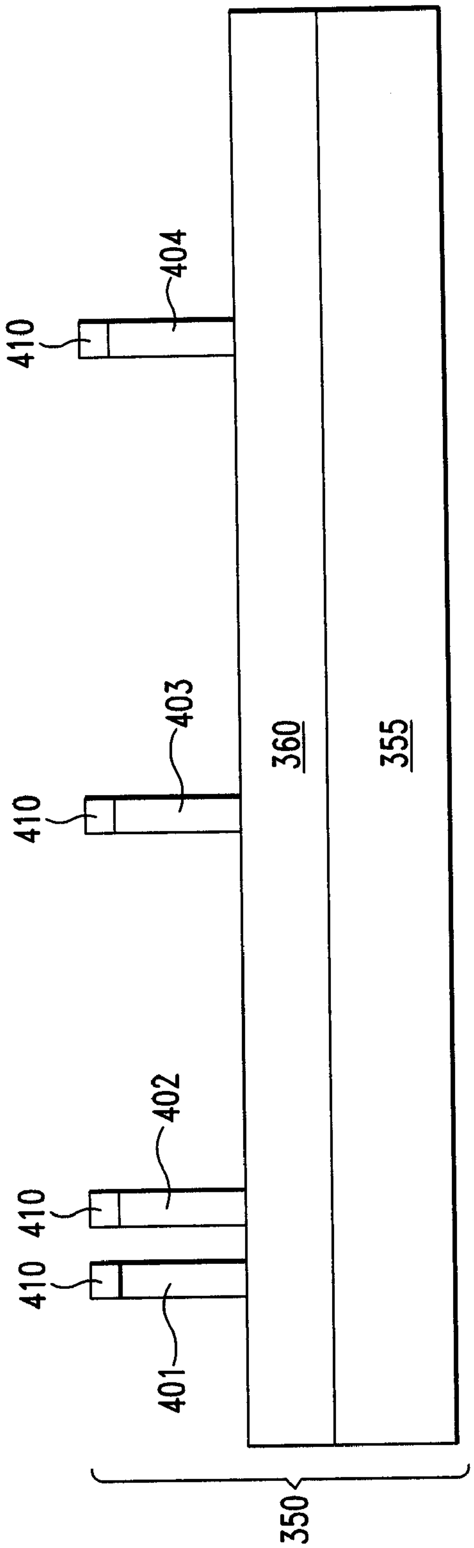
FIGS. 4 through 16 illustrate a sequence of steps that can be used to form the structures shown in FIGS. 1–3.

An exemplary method of constructing optical switches as shown in FIGS. 1–3 will be described. As illustrated in FIG. 4, a starting substrate 350, preferably a silicon-on-insulator (SOI) wafer comprising a bulk silicon layer 355 and a buried oxide layer 360, includes a masking layer 410 such as, for example, silicon oxide or silicon nitride. Masking layer 410 is patterned and the silicon etched according to the pattern to provide silicon bodies, also referred to as "fins" or planes, 401–404. The height of the planes is given by the thickness of the top silicon of the SOI wafer and is typically equal to or greater than one-half of the wavelength (as extant in the semiconductor) of the lowest-frequency of light to be switched. For example, using red light, with a wavelength in silicon of about 180 nm, the planes must be at least about 90 nm high. Also shown in FIG. 4 are other regions of the silicon which have been patterned and etched with the intent of forming mirrors or transistors in subsequent steps.

Figure 5:
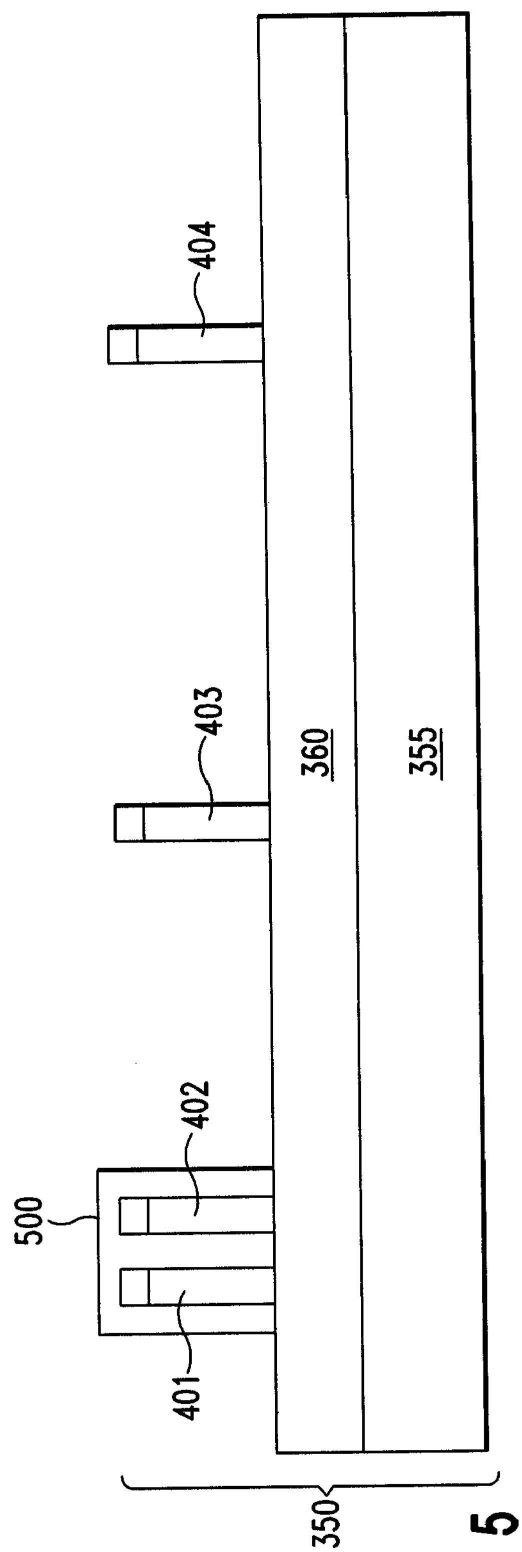

As shown in FIG. 5, a dielectric 500, is deposited or grown on the planes, preferably having a dielectric constant nearly equal to that of the substrate 350. For example, $Al_2O3$ would be a preferred dielectric as it presents a relative dielectric constant nearly equal to that of silicon. During this step, the regions to be used to construct transistors or mirrors are blocked.

Figure 6A:
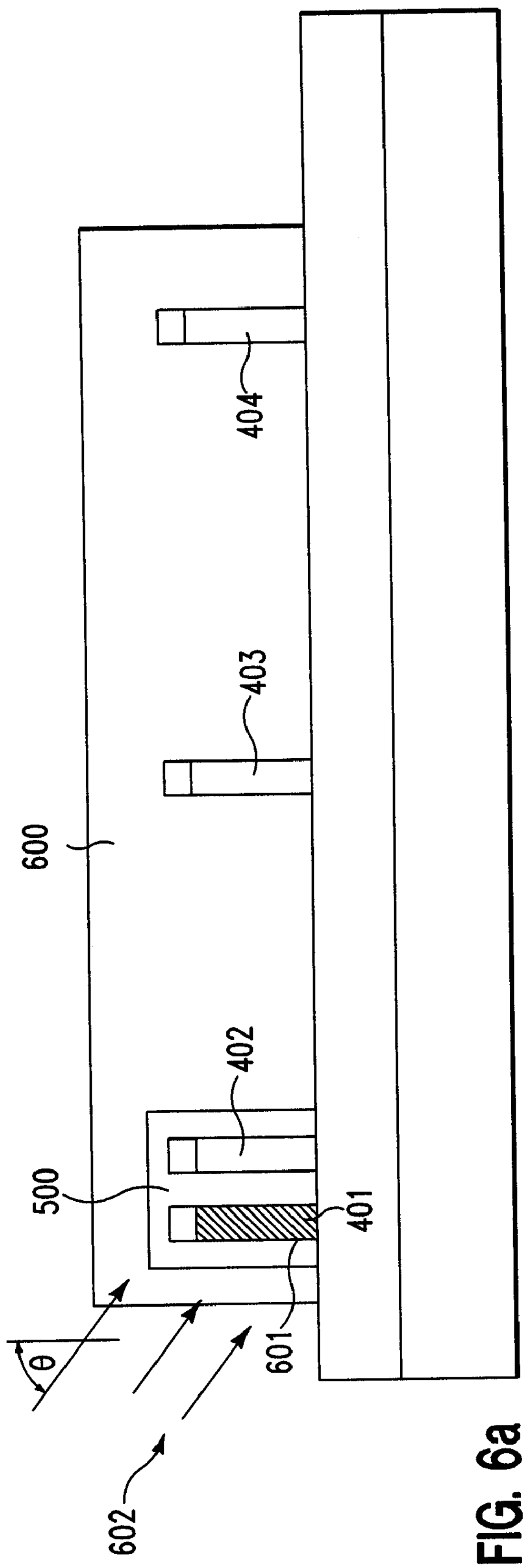
Figure 6B:
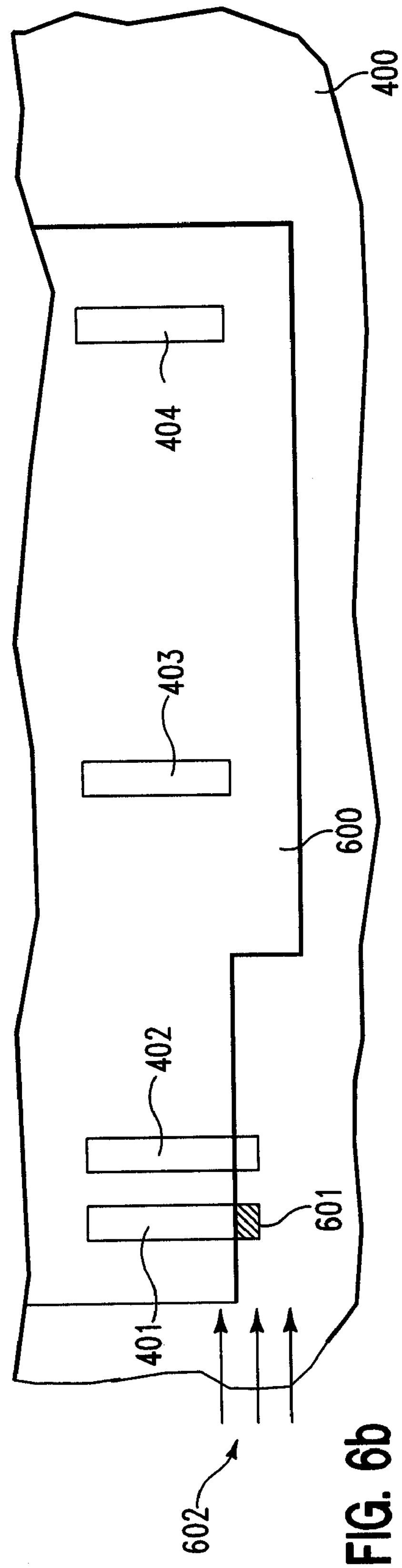

FIGS. 6A, B show a cross-sectional and plan views, respectively, of a first mask 600 that is used to allow selective doping of an edge 601 of a first 401 with an n-type dopant. For example, arsenic doping by ion implantation 602 is preferred. The ion implant 602 is tilted at an angle theta between about 30° to about 45° from vertical so as to shadow first plane 401 while implanting the edge 601.

Figure 7A:
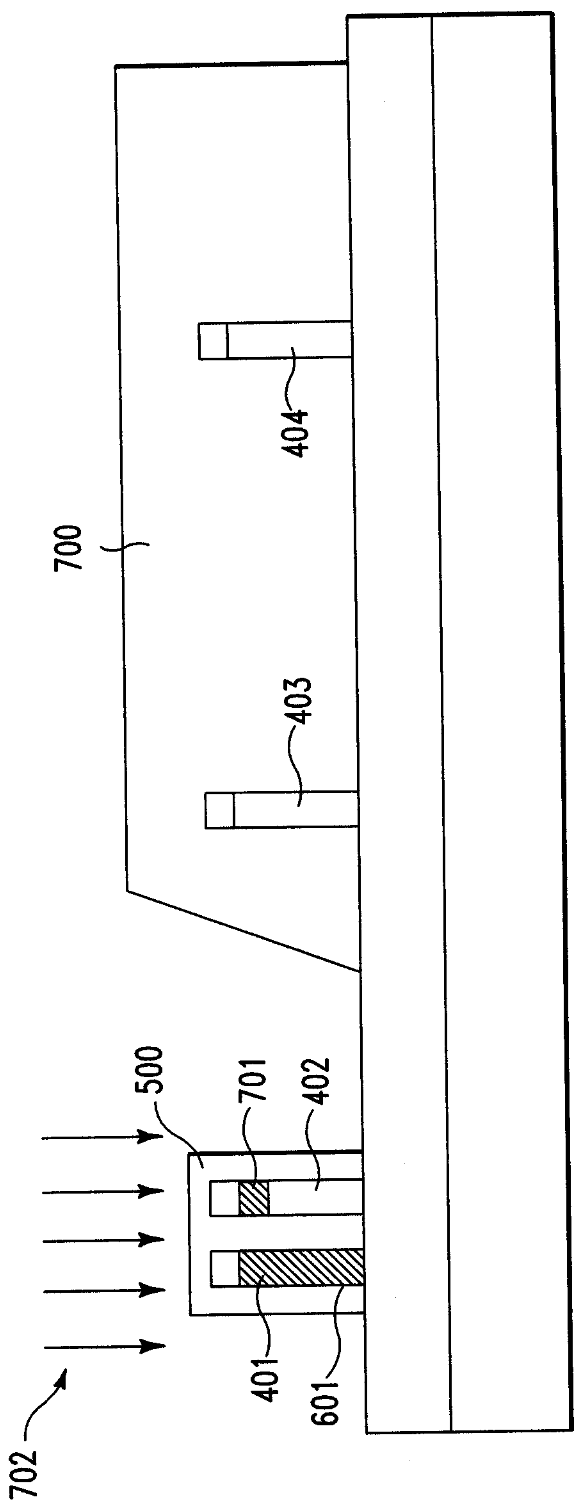
Figure 7B:
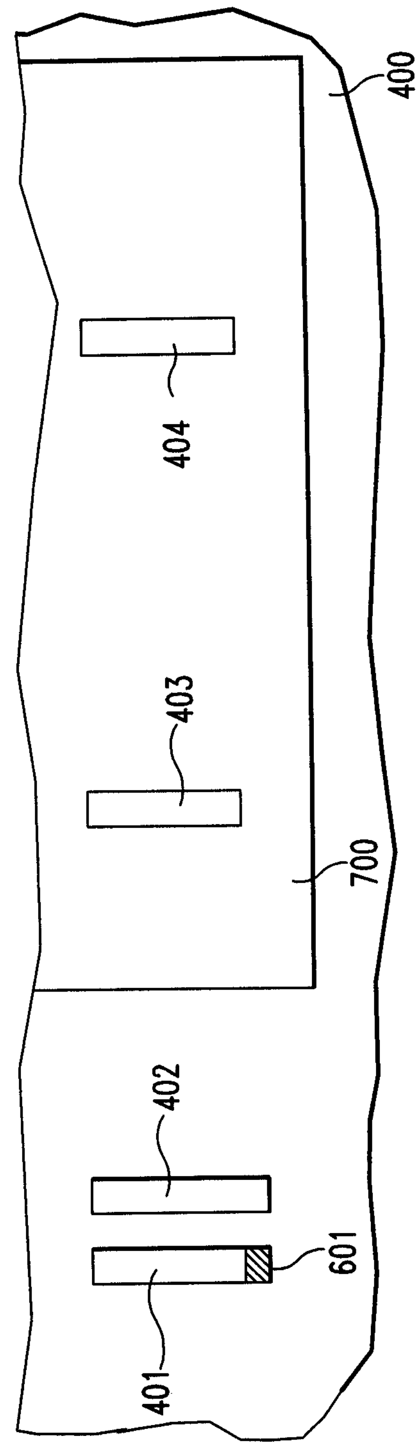

As shown in FIGS. 7A, B, a second mask 700 is used to allow selective doping of an edge 701 of a second plane 402 with a p-type dopant. For example, boron doping by ion implantation 702 is preferred. The ion implant 702 is substantially normal to the substrate 350, and can also enter the upper surface of plane 401 without any detrimental effects to the operation of the optical switch formed by the combination of planes 401 and 402.

Figure 8:
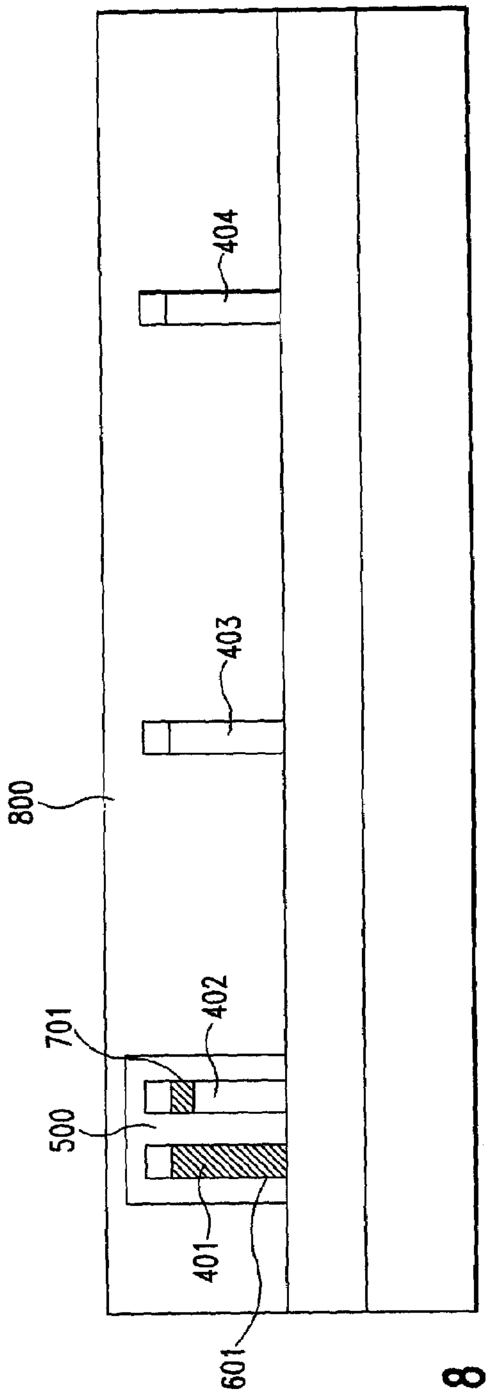

Referring to FIG. 8, a dielectric 800 is formed by, for example, a deposition process such as chemical vapor deposition (CVD). Dielectric 800 such as, for example, silicon dioxide, aluminum oxide, or other suitable insulators is formed over the entire surface of the wafer and then planarized.

Figure 9:
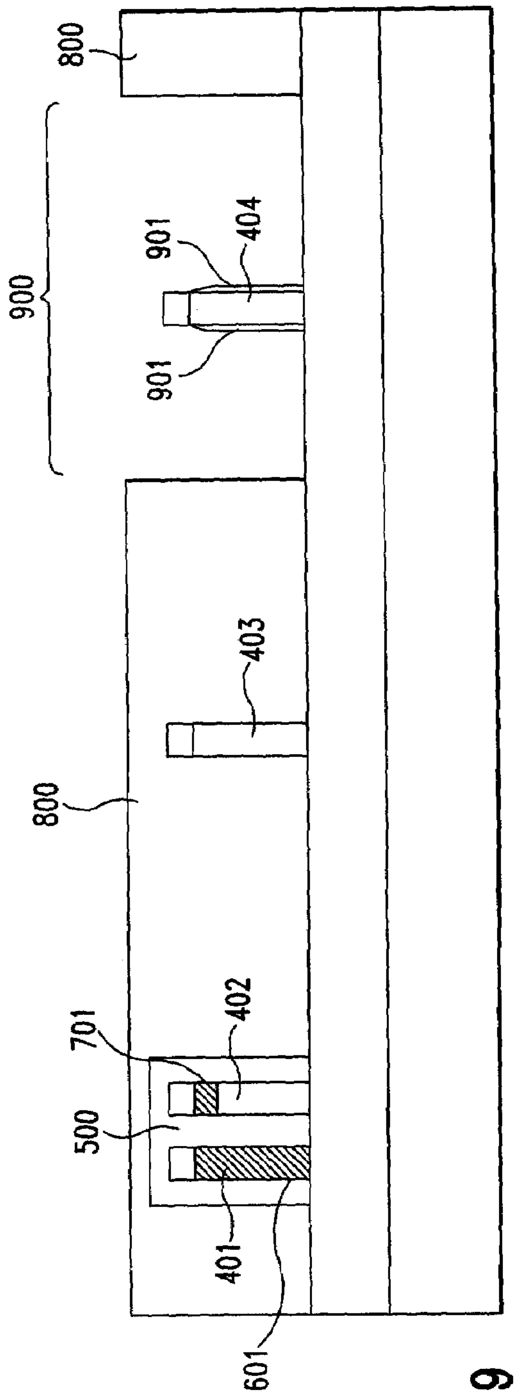

FIG. 9 shows a portion of dielectric 800 removed by methods known in the art such as, for example, photolithography and reactive ion etch, to form an opening 900. The remaining portions of dielectric 800 encapsulate planes 401–403 while transistors will be formed in opening 900 as described hereinafter. Exposed regions of semiconductor are doped according to need, typically with ion implantations of boron and arsenic for nFETs and pFETs, respectively, to adjust the threshold voltages of the FETs. A gate insulator 901 is grown and/or deposited, typically by methods known in the art such as, for example, thermal oxidation and nitridation.

Figure 10A:
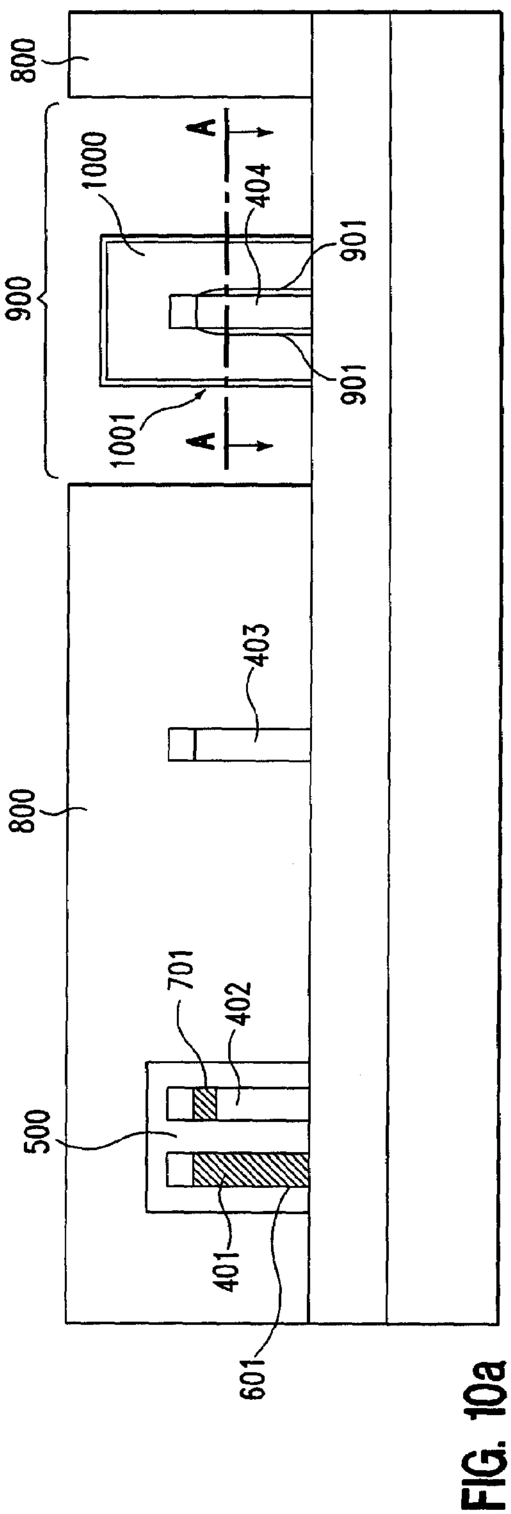
Figure 10B:
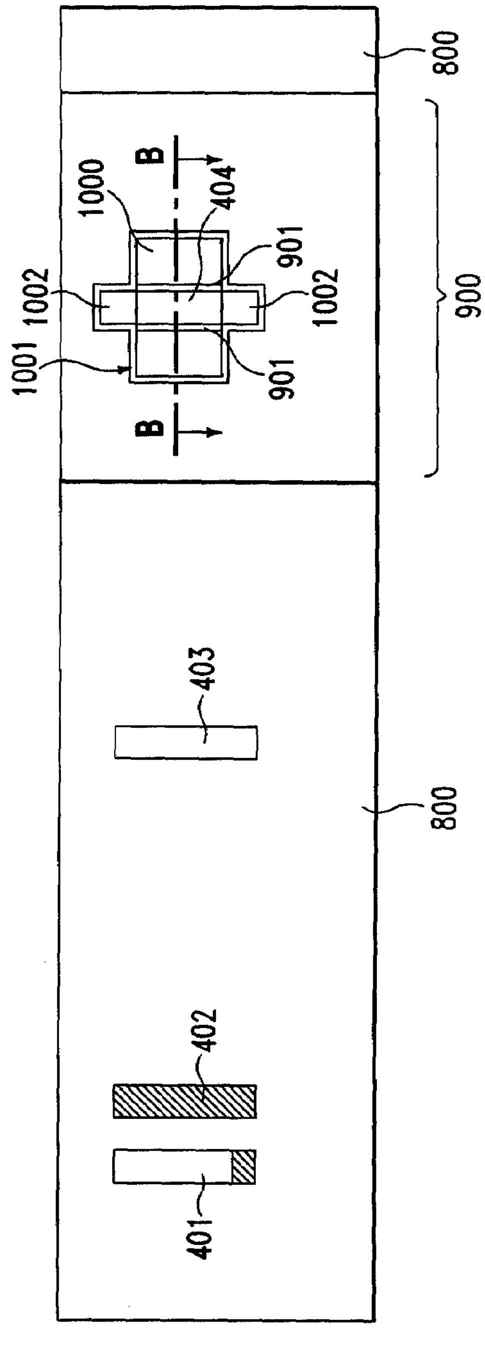

A gate electrode material such as, for example, polysilicon, is deposited, patterned and removed using known photolithographic and etch techniques to form gate 1000 on plane 404 as shown in FIGS. 10A, B (see, for example, U.S. Pat. No. 6,252,284 herein incorporated by reference in its entirety). (It should be noted that in FIGS. 10A, 11A and 12A, gate 1000 is represented as a side cross-sectional view as taken through a section B—B of corresponding FIGS. 10B, 11B and 12B. Likewise, gate 1000 is represented in FIGS. 10B, 11B and 12B as a top cross-sectional view as taken through a section A—A of corresponding FIGS. 10A, 11A and 12A). A thin dielectric 1001 such as, for example, silicon oxide is grown or deposited, and source and drain extensions 1002 are formed by ion implantation of suitable species into the exposed areas of opening 900. Typically arsenic is implanted at a dose of $1\times10^{15}$ cm−2 and energy between 1 and 5 keV for nFETs and boron diflouride at a dose of $1\times10^{15}$ cm−2 at an energy of 0.5 to 3 keV for pFETs. Optionally halos may be co-implanted with the extensions for improved short-channel control.

Figure 11A:
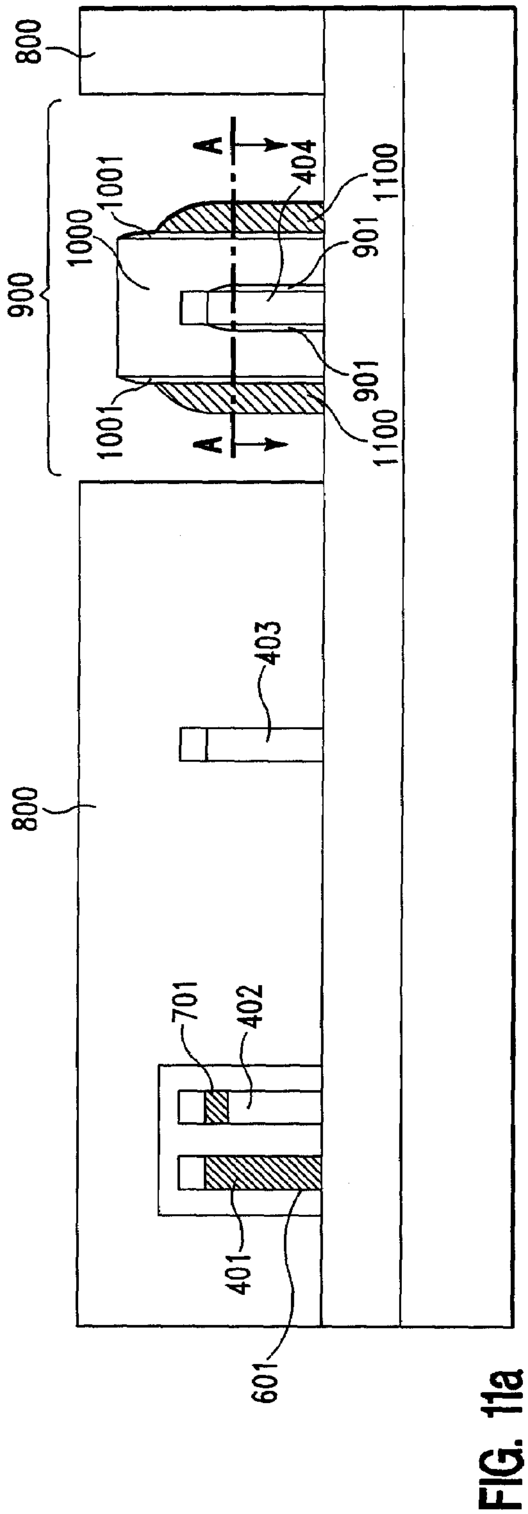
Figure 11B:
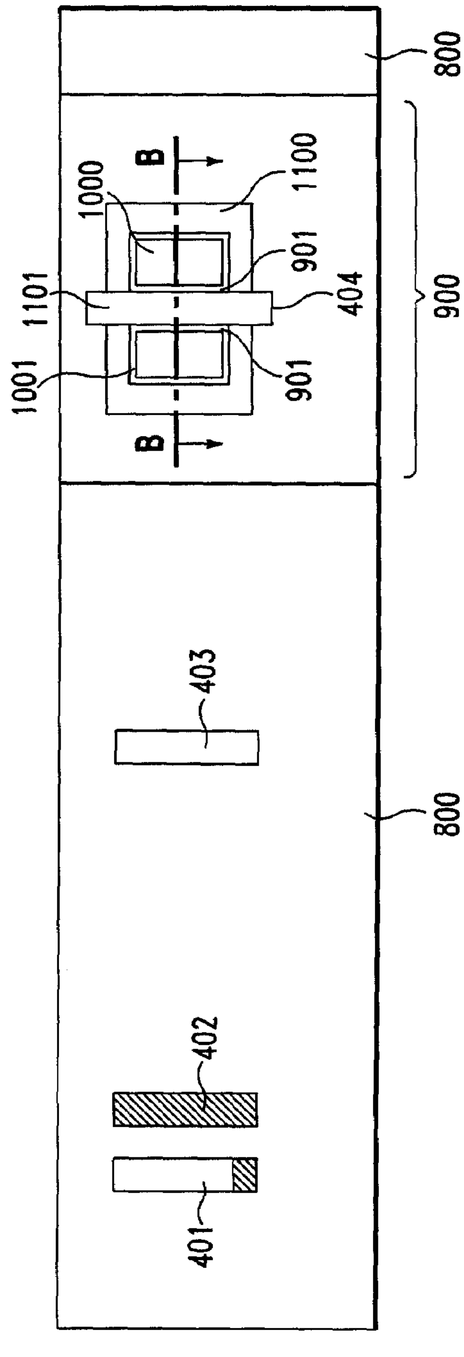

Referring to FIGS. 11A, B, spacers 1100 are formed by processes known in the art such as, for example, a conformal CVD of a material, preferrably silicon nitride, followed by directional etching. Sources and drains 1101 are then formed by ion implantation, typically arsenic at $3–5\times10^{15}$ cm−2 and an energy of 1 to 10 keV for nFETs and boron at a dose of $3–5\times10^{15}$ cm−2 and an energy of 0.5 to 5 keV for pFETs.

Figure 12A:
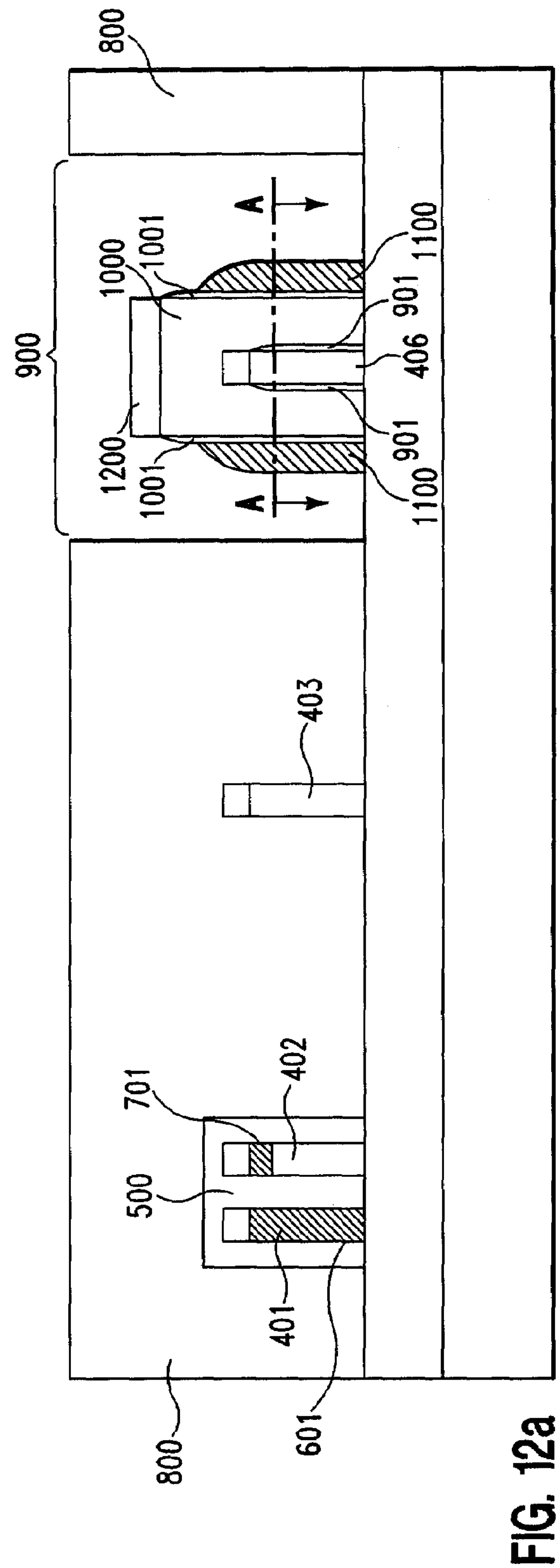
Figure 12B:
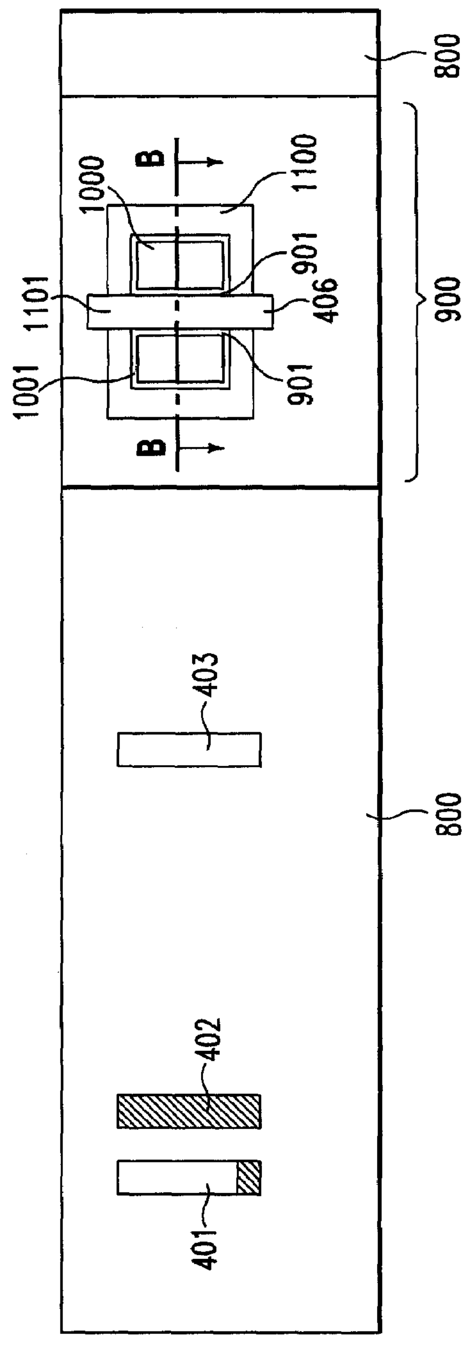

A silicide is formed by depositing a suitable metal such as, for example, titanium, cobalt, or nickel, and annealing to selectively form a metal silicide where the metal is in contact with silicon as shown in FIGS. 12A, B. The remaining metal is selectively removed to leave silicide only on the sources, drains and gates of the FinFET 406.

Figure 13:
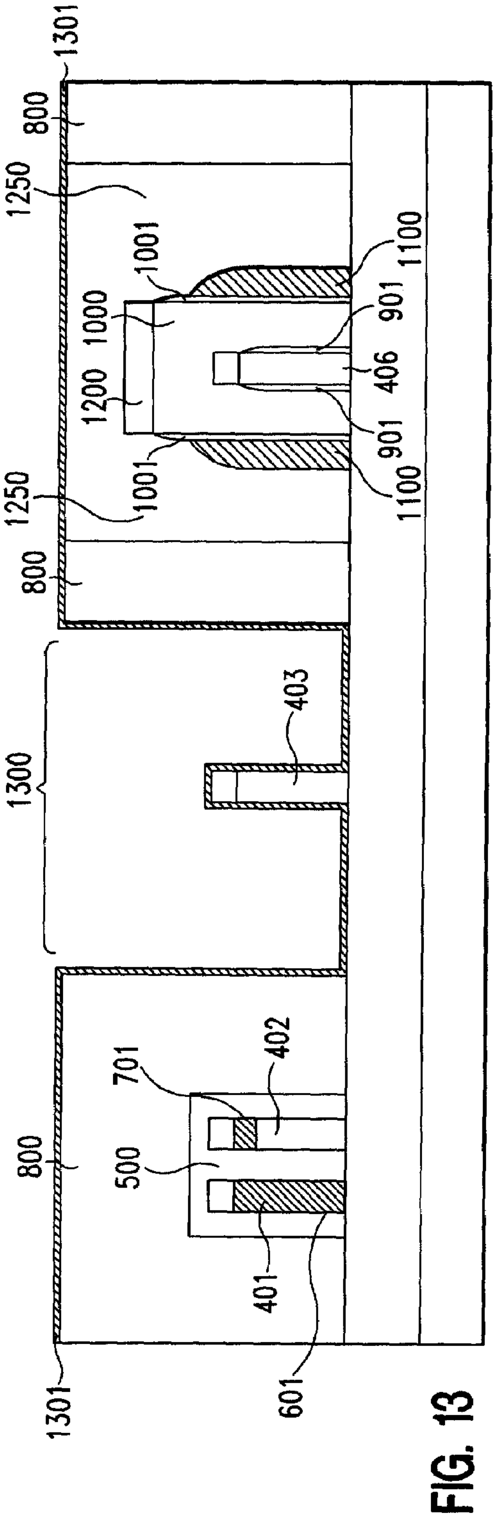

FIG. 13 shows a protective layer 1250 deposited and planarized to protect the previously exposed opening 900 and FinFET 406. Next, the dielectric 800 is selectively removed from a region 1300 where a mirror is to be formed. A metal 1301 such as, for example, aluminum, is deposited by evaporation, sputtering or other means, to 'silver' the exposed plane 403, thereby forming mirrors.

Figure 14:
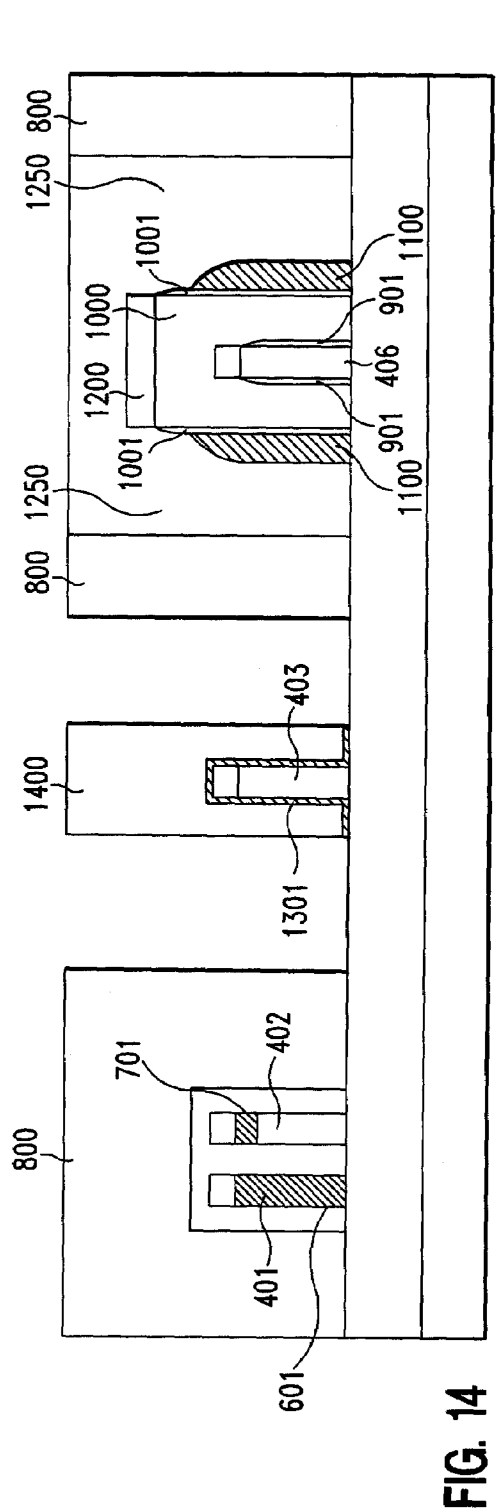

A mask 1400 is formed using conventional photolithography over the silvered plane 403 as shown in FIG. 14. Exposed metal 1301 is removed using, for example, an anisotropic etch. Mask 1400 is then removed.

Figure 15:
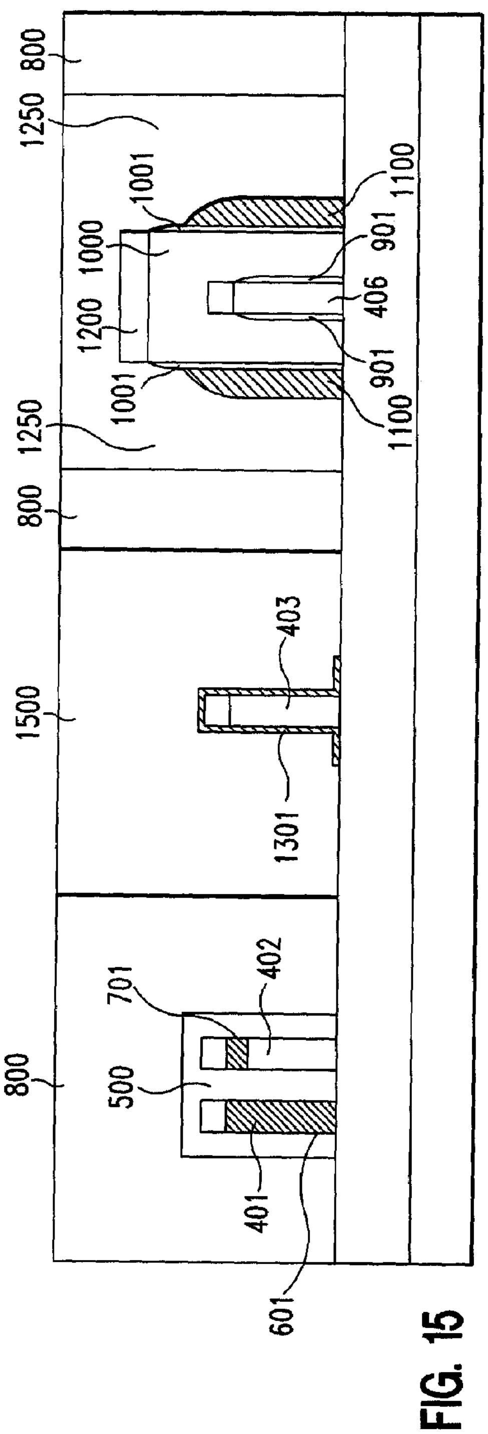

Referring to FIG. 15, a dielectric layer 1500, preferably having a dielectric constant approximately equal to that of the semiconductor (i.e. silicon) which is used to form planes 401–404, is deposited on the entire exposed surface in order to fill opening 1300. Dielectric layer 1500 is planarized by chemical-mechanical polishing and/or etch back to approximately the level of the dielectric layer 800.

Figure 16:
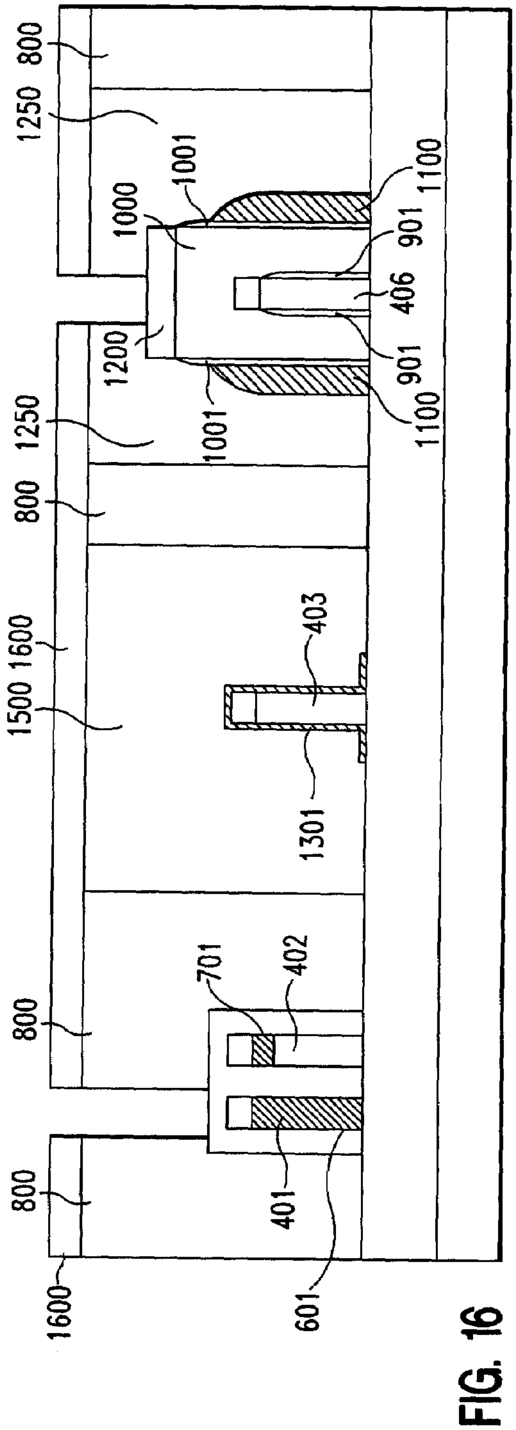

Construction of the three major components to be integrated, namely optical switches (401, 402), mirror (403) and FinFET (404), have been described hereinabove. Subsequent processes which are known to those skilled in the art of large-scale integration can be used to provide contacts and interconnects to wire the transistors to each other and to optical switches. For example, FIG. 16 shows a dielectric layer 1600 which is patterned to provide contacts and interconnects (not shown) to wire the optical switches 401, 402 to the transistor 406. Thus, an integrated optical/electrical integrated circuit is formed according to an embodiment of the invention.

While embodiments of the invention have been described, it is to be understood that the spirit and scope of the invention is not limited thereby. Rather, various modifications may be made to embodiments of the invention without departing from the overall scope of the invention as described above and as set forth in the several claims appended hereto. For example, although the present invention describes a FinFET (406) formed with optical switches (401, 402), it will be understood to those skilled in the art that other devices such as, for example, a planar FET, a dual-gate FET, a bipolar junction transistor or other such devices can also be formed with optical switches 401, 402.

We claim:

1. An integrated circuit chip comprising a first portion with a plurality of transistors comprised of a first plurality of discrete semiconductor bodies, and at least one optical switch comprised of a second plurality of discrete semiconductor bodies sufficiently doped, wherein incoming radiation is reflected or transmitted by said at least one optical switch.

2. The integrated circuit chip of claim 1, wherein said second plurality of discrete semiconductor bodies are substantially parallel to each other.

3. The integrated circuit chip of claim 1, wherein a first of said second plurality of discrete semiconductor bodies are adjacent a second of said second plurality of discrete semiconductor bodies and have first and second respective majority carrier types.

4. The integrated circuit chip of claim 3, wherein said first and second of said plurality of discrete semiconductor bodies are coupled to respective voltage sources, said first and second of said plurality of discrete semiconductor bodies are selectively substantially depleted of majority carriers to alter their transmissive response to incoming radiation.

5. The integrated circuit chip of claim 3, wherein said first of said second plurality of discrete semiconductor bodies is inter-digitated with said second of said second plurality of discrete semicondutor bodies.

6. The integrated circuit chip of claim 1, wherein said plurality of transistors are selected from the group including FinFETs, planar FETs, dual-gate FETs and bipolar junction transistors.

7. The integrated circuit chip of claim 1 further comprising a mirror comprised of a third discrete semiconductor body.

8. An optical switch receiving incoming radiation at a given frequency, said optical switch comprising a plurality of semiconductor bodies adjacent one another and having first and second respective majority carrier types, said plurality of semiconductor bodies being coupled to respective voltage sources, wherein said plurality of semiconductor bodies are selectively substantially depleted of majority carriers to alter a transmissive response of said bodies to said incoming radiation.

9. The optical switch of claim 8, wherein said plurality of semiconductor bodies are substantially parallel to each other.

10. The optical switch of claim 8, wherein a first of said plurality of semiconductor bodies having said first majority carrier type comprises a first portion doped with a first dopant and a second of said plurality of semiconductor bodies having said second majority carrier comprises a second portion doped with a second dopant.

11. The optical switch of claim 10, wherein said first dopant comprises an n-type dopant and said second dopant comprises a p-type dopant.

12. The optical switch of claim 11, wherein said n-type dopant comprises arsenic and said p-type dopant comprises boron.

13. The optical switch of claim 12, wherein said plurality of semiconductor bodies are depleted of majority carriers when an electrical potential of said p-type portion is less than an electrical potential of said n-type portion by about a threshold voltage.

14. The optical switch of claim 8, wherein said plurality of semiconductor bodies comprises a first plurality of semiconductor bodies inter-digitated with a second plurality of semicondutor bodies.

15. The optical switch of claim 14, wherein said first plurality of semiconductor bodies are coupled to a first voltage source and said second plurality of semiconductor bodies are coupled to a second voltage source.

16. An optical switch comprising a plurality of fin bodies on a substrate, said plurality of fin bodies disposed parallel to one another and having central portions defining an optical path and doped end portions, a first plurality of said fin bodies having an end portion doped with a first dopant and a second plurality of said fin bodies having an end portion doped with a second dopant, said first plurality of said fin bodies being coupled to a first voltage source and said second plurality of said fin bodies being coupled to a second voltage source, wherein said plurality of fin bodies are selectively substantially depleted of majority carriers to alter a transmissive response of said fin bodies to incoming radiation.

17. The optical switch of claim 16, wherein said first dopant comprises an n-type dopant and said second dopant comprises a p-type dopant.

18. The optical switch of claim 17, wherein said n-type dopant comprises arsenic and said p-type dopant comprises boron.

19. The optical switch of claim 18, wherein said plurality of fin bodies are depleted of majority carriers when an electrical potential of said p-type portion is less than an electrical potential of said n-type portion by about a threshold voltage.

20. The optical switch of claim 16, wherein said plurality of fin bodies comprises a first plurality of fin bodies inter-digitated with a second plurality of fin bodies.

21. The optical switch of claim 20, wherein said first plurality of fin bodies are coupled to a first voltage source and said second plurality of fin bodies are coupled to a second voltage source.

22. The optical switch of claim 16, said substrate is selected from one of the group comprising silicon, silicon-on-insulator, silicon carbide or gallium arsenide.

23. The optical switch of claim 16, wherein said plurality of fins comprises a portion of said substrate.

24. The optical switch of claim 16, wherein said plurality of fins are formed in a substantially rectangular shape.

25. The optical switch of claim 16, wherein the incoming radiation is incident on said plurality of fins at approximately a 90-degree angle.

26. A method of forming an optical switch for receiving incoming radiation at a given frequency, the method comprising the steps of:

providing a substrate;

removing portions of the substrate to form a plurality of semiconductor bodies adjacent one another;

selectively doping an end portion of a first of said plurality of semiconductor bodies with a first dopant; and selectively doping an end portion of a second of said plurality of semiconductor bodies with a second dopant.

27. The method of claim 26, wherein said substrate comprises silicon.

28. The method of claim 26, wherein said plurality of semiconductor bodies are substantially parallel to each other.

29. The method of claim 26, wherein said steps of selectively doping comprise ion implanting an n-type dopant and a p-type dopant, respectively.

* * * * *